(12) United States Patent
Tran

(10) Patent No.: US 7,127,830 B2
(45) Date of Patent: Oct. 31, 2006

(54) RETICLE CARRIER APPARATUS AND METHOD THAT TILTS RETICLE FOR DRYING

(75) Inventor: Hai Tran, Vancouver, WA (US)

(73) Assignee: WaferTech, LLC, Camas, WA (US)

(*) Notice: Subject to any disclaimer, the term of this patent is extended or adjusted under 35 U.S.C. 154(b) by 0 days.

(21) Appl. No.: 10/910,221

(22) Filed: Aug. 2, 2004

(65) Prior Publication Data
US 2006/0021247 A1    Feb. 2, 2006

(51) Int. Cl.
F26B 21/06    (2006.01)

(52) U.S. Cl. .................. 34/381; 34/78; 34/90; 34/218; 134/102.1

(58) Field of Classification Search .............. 34/380, 34/381, 62, 77, 78, 90, 218; 134/102.1
See application file for complete search history.

(56) References Cited

U.S. PATENT DOCUMENTS

| | | | |
|---|---|---|---|
| 4,231,806 A | 11/1980 | Henry | |
| 4,483,040 A | 11/1984 | Magee et al. | |
| 4,570,279 A | 2/1986 | Yoshizawa | |
| 4,694,527 A | 9/1987 | Yoshizawa | |
| 4,715,392 A | 12/1987 | Abe et al. | |
| 5,483,983 A | 1/1996 | Briggs et al. | |
| 5,916,374 A | 6/1999 | Casey et al. | |
| 5,964,958 A * | 10/1999 | Ferrell et al. | 134/26 |
| 6,032,683 A | 3/2000 | Casey et al. | |
| 6,216,873 B1 | 4/2001 | Fosnight et al. | |
| RE37,627 E * | 4/2002 | Hirano | 34/426 |
| 6,500,588 B1 | 12/2002 | Williams | |
| 6,532,974 B1 * | 3/2003 | Kashkoush et al. | 134/56 R |
| 6,558,477 B1 * | 5/2003 | Scovell | 134/30 |
| 6,558,836 B1 | 5/2003 | Whitacre et al. | |
| 2003/0121170 A1 * | 7/2003 | Achkire et al. | 34/78 |
| 2003/0129505 A1 * | 7/2003 | Shiraishi et al. | 430/5 |

OTHER PUBLICATIONS

Page titled "Akrion's Reticle Mask Carrier" from Akrion Business Overview presented by Akrion representative to Wafer Tech, on Apr. 11, 2002.

* cited by examiner

*Primary Examiner*—S. Gravini
(74) *Attorney, Agent, or Firm*—Duane Morris LLP

(57) ABSTRACT

A method and apparatus for cleaning, rinsing and drying a reticle used in semiconductor device manufacturing, tilts the reticle during the drying process to prevent water from the rinsing process from collecting and remaining on the reticle. The rectangularly shaped reticle is held in a carrier and the top and bottom edges of the reticle may form an angle of at least about 8° with the horizontal to maximize drying efficiency, when the carrier is placed on a horizontal surface or suspended from above.

22 Claims, 4 Drawing Sheets

RETICLE CARRIER APPARATUS AND METHOD THAT TILTS RETICLE FOR DRYING

FIELD OF THE INVENTION

The invention relates to a method and apparatus for cleaning and drying a reticle used in the production of semiconductor integrated circuits.

BACKGROUND

Reticles are used in the semiconductor device manufacturing process and are typically formed of a quartz substrate with an opaque pattern formed on one of the surfaces of the quartz substrate. The opaque pattern is generally formed of chrome. The reticle is generally thin, flat and rectangular in shape. Reticles are used to produce patterns of very small dimensions on semiconductor substrates. The patterns may include device features with dimensions in the nanometer range. It is therefore important to keep the reticle very clean because any foreign contamination on the reticle can produce an irregular or distorted pattern. Several reticles are required to produce a single semiconductor device which includes multiple device levels. Since a pattern irregularity due to a dirty reticle at any level of device processing can cause device failure, it is even more critical to maintain each of the several reticles in clean condition to maximize device yield.

Many techniques are used for cleaning reticles and most of these techniques include disposing the reticle in a cleaning solution then rinsing the cleaning solution from the reticle. After the reticle is rinsed, a drying operation takes place. A shortcoming of the present technology is that the rectangular reticles are transported from station to station and then allowed to dry in carriers that orient the reticle with its opposed upper and lower edges essentially in a horizontal position. In conventional reticle carriers, this is true when the carrier is placed on a flat horizontal surface and also if the carrier is suspended from above. When the reticle dries in such a horizontal configuration, the rinsing liquid, typically deionized water, will remain on the top edge of the reticle as well as along the bottom edge of the reticle. When allowed to dry in the ambient air of a semiconductor device fabrication facility, the deionized water remains on the top edge and bottom edge of the horizontally positioned reticle, even after 30 minutes of drying. This residual deionized water is undesirable because it can potentially move to the surface of the reticle, distorting the pattern, when the reticle is eventually maneuvered. If a turbulent airflow is used to remove the residual water, the turbulent airflow itself and/or the disbursing deionized water can result in particles or water droplets on the reticle surface and these particles or water droplets can cause pattern defects and device failure.

It would therefore be desirable to provide a reticle cleaning and drying method and apparatus that cleans and dries the reticle without leaving contaminating particles or residual water.

SUMMARY OF THE INVENTION

To address these and other objects and in view of its purposes, the invention provides a method for wet processing and drying a reticle. The method includes providing a substantially flat and rectangular reticle that is wet and drying the reticle by orienting a bottom edge of the reticle at an angle of at least about 8° with the horizontal.

In another aspect, the invention provides a reticle drying apparatus comprising a carrier that holds a rectangular and flat reticle such that a bottom edge of the reticle forms an angle of at least 8° with the horizontal when the carrier is suspended from a carrier handle.

In a further aspect, the invention provides a reticle drying apparatus with at least a first bath that contains a cleaning liquid, a second bath with a rinsing liquid, and means for mechanically transporting a reticle out of the second bath in a carrier that positions a bottom edge of the reticle at an angle of at least about 8° with the horizontal when the carrier is suspended from a handle.

BRIEF DESCRIPTION OF THE DRAWING

The invention is best understood from the following detailed description when read in conjunction with the accompanying drawing. It is emphasized that, according to common practice, the various features of the drawing are not necessarily to scale. On the contrary, the dimensions of the various features are arbitrarily or expanded or reduced for clarity. Like numerals denote like features throughout the specification and drawing. Included in the drawing are the following figures.

DETAILED DESCRIPTION

The invention provides a carrier that holds a reticle such that the bottom edge of the rectangularly shaped reticle forms an angle of about at least 8 to 10° with the horizontal. The carrier may be used for transporting the reticle between wet cleaning and rinsing operations, it may be used to hold the wafer during the wet cleaning or rinsing operations and it is advantageously used for subsequent drying processes.

Figure 1:
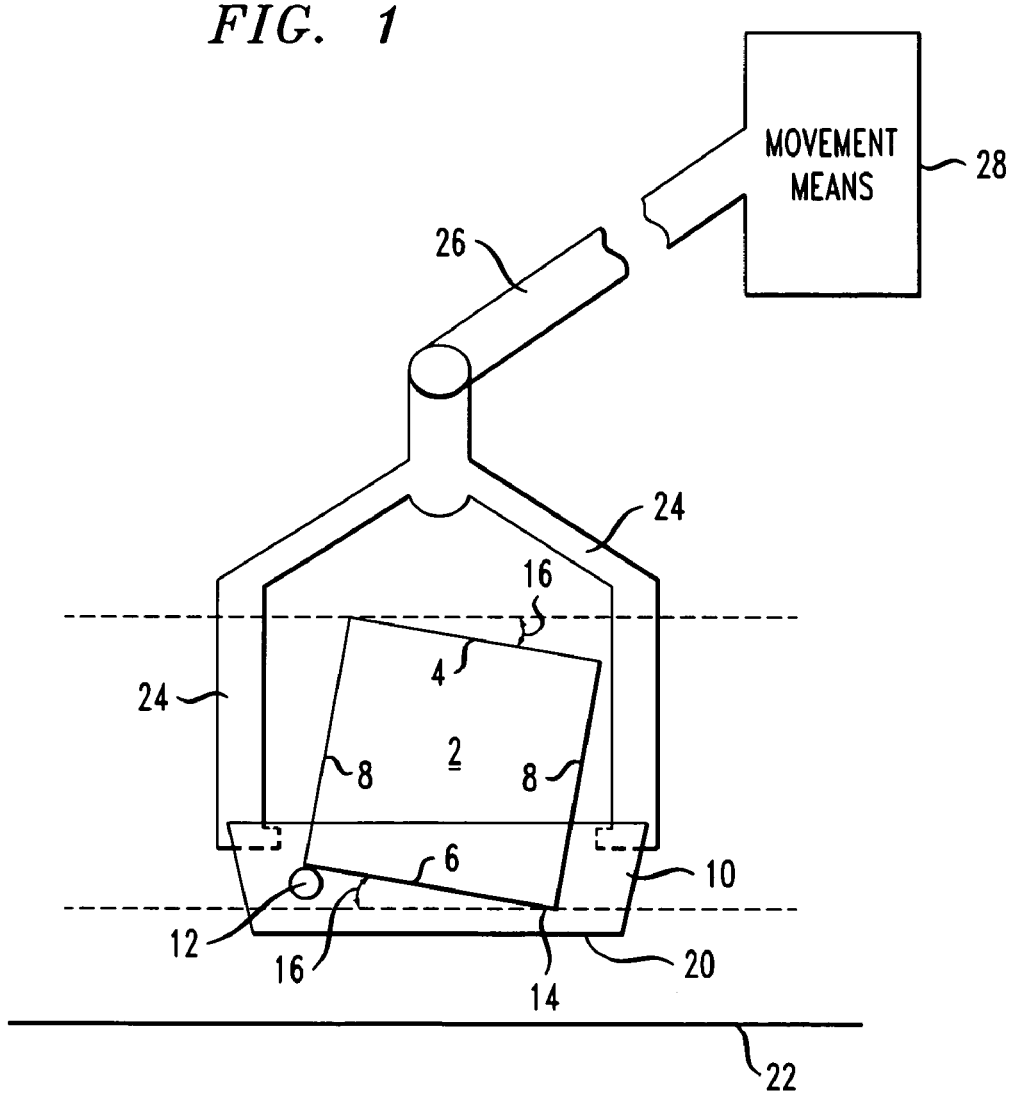
FIG. 1 is a side and perspective view showing a carrier holding a reticle according to an embodiment of the invention.

FIG. 1 shows an exemplary reticle 2 held within carrier 10. Reticle 2 is flat and rectangular in shape and includes opposed top edge 4 and bottom edge 6 as well as opposed side edges 8. Conventional reticles used in the semiconductor manufacturing industry may include an opaque pattern formed on a substrate. The substrate is typically formed of quartz but other transparent materials such as soda lime, borosilicate glass, or fused silica may be used as the substrate. The opaque pattern is typically formed of chrome but other suitable materials may also be used. Carrier 10 may be formed of PFA, polyfluoro alcohol, which is resistant to attack in the acidic and basic cleaning solutions used to clean reticles in various embodiments. In other exemplary embodiments, carrier 10 may be formed of other suitable plastics, PVC, polyvinyl chloride, or other materials chosen in conjunction with the materials that will contact the carrier. Although only one reticle 2 is illustrated as being received within carrier 10 in the side view illustration of FIG. 1, carrier 10 may hold a plurality of reticles 2 in the same orientation and they may be aligned behind the illustrated reticle 2.

When received within exemplary carrier 10, reticle 2 rests on a mechanical support or mechanical supports that position bottom edge 6 and top edge 4 at angle 16 with respect to the horizontal indicated by the dashed lines. In one exemplary embodiment, angle 16 is 10° and in other exemplary embodiments angle 16 may range from about 5° to 45°. In one particular exemplary embodiment, angle 16 may be at least about 8°. In another exemplary embodiment angle 16 may be at least about 10° and in yet another embodiment, angle 16 may range from 10° to 15°. In the illustrated embodiment, the mechanical supports are bar 12 and recession 14 that the opposed corners of bottom edge 6 rest upon, but in other exemplary embodiments, other mechanical supports such as a continuous groove may be used to maintain reticle 2 positioned at angle 16 with respect to the horizontal.

In one embodiment, reticle 2 is maintained at above-described angle 16 with respect to the horizontal when carrier 10, in particular bottom plane 20 of carrier 10, is placed on substantially horizontal surface 22. Bottom plane 20 may consist of a number of discrete support members arranged in a plane or a continuous flat surface. As such, when reticle 2 is held by exemplary carrier 10, bottom edge 6 is disposed at angle 16 with respect to bottom plane 20. Carrier 10 also maintains reticle 2 at angle 16 with respect to the horizontal when carrier 2 is suspended from above. For example, when exemplary carrier 10 is suspended in air by means of carrier handle 24 and arm 26, reticle 2 is maintained at angle 16 with respect to the horizontal. The illustrated exemplary embodiment shows carrier handle 24 aligned in an essentially vertical position and arm 26 generally in a horizontal position. Carrier handle 24 may grasp carrier 10 using various conventional mechanical means. In one exemplary embodiment such as illustrated in FIG. 1, carrier 10 may include receptacles 22 that receive a corresponding protuberance from carrier handle 24.

Arm 26 may be a robotic arm coupled to movement means 28 which moves robotic arm 26 and therefore carrier handle 24, carrier 10 and reticle 2. Movement means 28 may include a motor, software, various mechanical couplings, and a control panel to automatically or manually move carrier 10. For example, in a wet bench used to clean and rinse reticle 2, arm 26, in conjunction with movement means 28, may move reticle 2 into and out of numerous cleaning baths, rinsing stations, and to a drying position.

Figure 2:
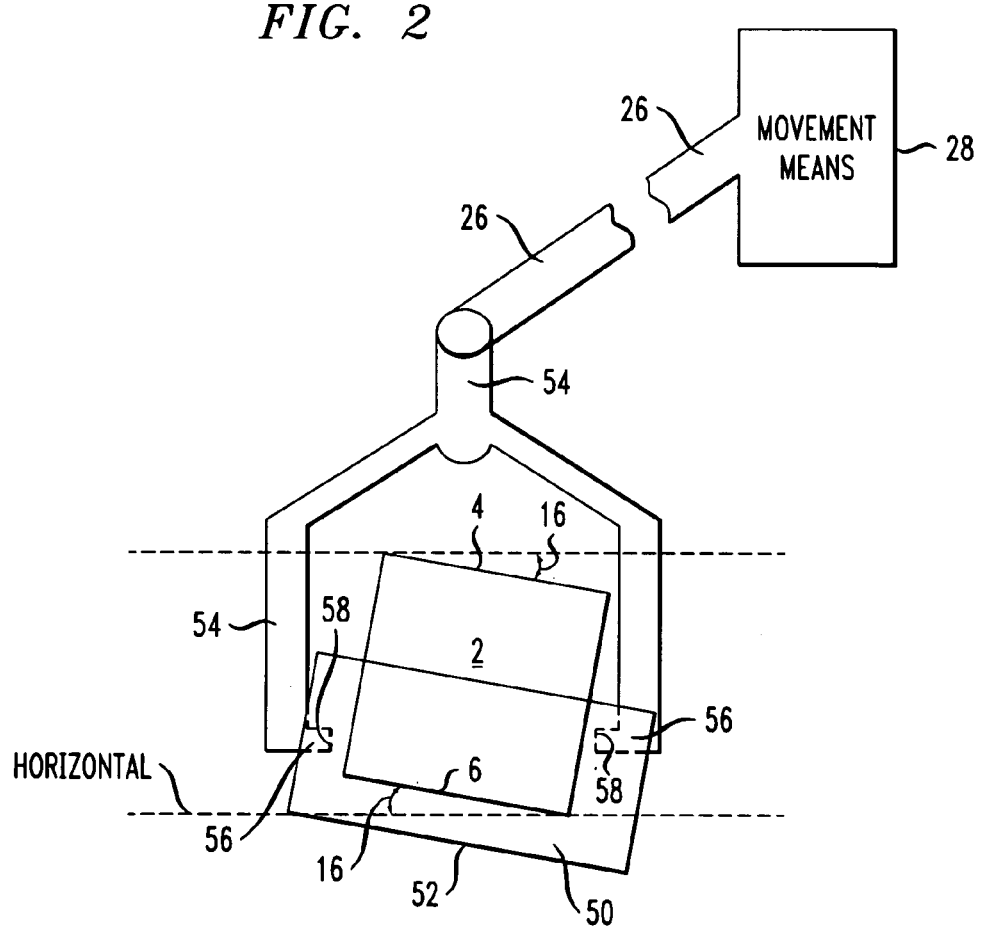
FIG. 2 is a side and perspective view of another embodiment of a carrier holding a reticle according to the invention.

FIG. 2 shows another exemplary arrangement of carrier 50 and carrier handle 54 in which reticle 2 is disposed at angle 16 with respect with to the horizontal (i.e. the dashed line), when carrier 50 is grasped by and suspended from carrier handle 54. In this exemplary embodiment, bottom plane 52 of carrier 50 is substantially parallel to bottom edge 6 of reticle 2 when reticle 2 is received within carrier 50. In the illustrated arrangement, carrier handle 54 grasps carrier 50 such that bottom edge 6 and bottom plane 52 are tilted at angle 16 with respect to the horizontal. In the illustrated embodiment, protuberances 56 of carrier handle 54 are received within corresponding recesses 58 of carrier 50 to position reticle 2 at angle 16. In other exemplary embodiments, other mechanical features may be used so that bottom edge 6 of reticle 2 is disposed at angle 16 with respect to the horizontal when carrier 50 is coupled to carrier handle 54 and suspended. In other exemplary embodiments, angle 16 may be achieved by various combinations of tilting the carrier with respect to the horizontal and tilting reticle 2 with respect to the carrier.

Figure 3:
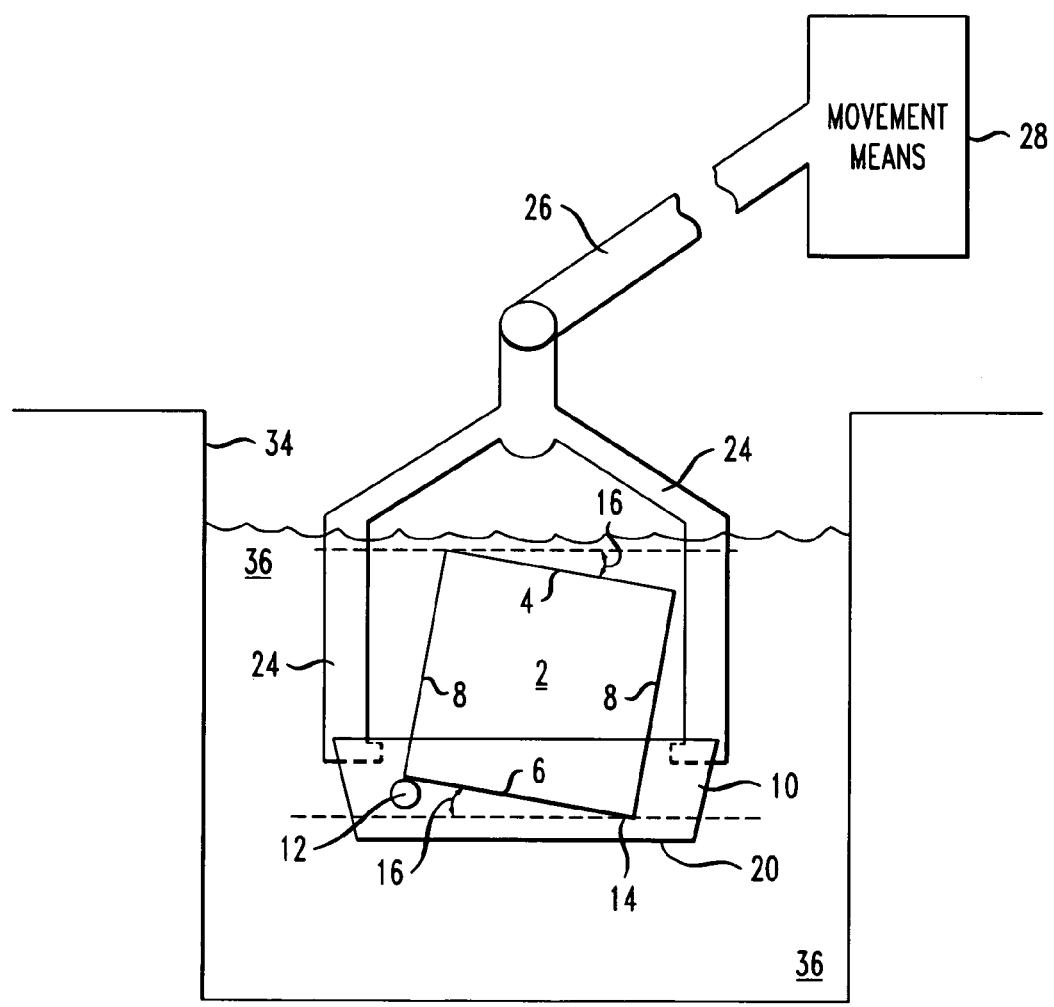
FIG. 3 is a side and perspective view showing a reticle, held by an exemplary carrier, being processed in a bath, according to the invention.

FIG. 3 shows exemplary carrier 10 and reticle 2 positioned in exemplary bath 34 and also in liquid 36. In another exemplary embodiment, the exemplary arrangement shown in FIG. 2, including carrier 50 and carrier handle 54, may be used. Bath 34 and liquid 36 may represent any of various cleaning or rinsing operations. In one aspect of the invention, the reticle wet cleaning process may include a two step chemical cleaning process. The first chemical bath may be an $H_2SO_4/H_2O_2$ bath maintained at 80–90° C. with the sulfuric acid constituting a large majority of the solution. The second chemical bath may include $NH_4OH$ at about 1% concentration and $H_2O$ also at about 1% concentration, in DI $H_2O$, deionized water, at about 40° C. Other temperatures, other cleaning solutions and other sequences may be used in other exemplary embodiments. Reticle 2 is held by carrier 10 during the cleaning operation or operations and is transported in and out of the cleaning solutions using movement means 28, arm 26 and carrier handle 24. The various cleaning solutions such as may be represented by liquid 36, may be stagnant solutions or they may be dynamic solutions. While in a chemical bath such as exemplary bath 34, reticle 2 may be maintained at an angle such as angle 16 with respect to horizontal or it may be maintained in various other orientations such as with top edge 4 and bottom edge 6 being essentially horizontal.

After the chemical cleaning solutions, movement means 28 and arm 26 move carrier 10 and reticle 2 into a rinsing bath. Exemplary bath 34 may alternatively be a rinsing bath. Deionized water is preferred as the rinsing medium, but other rinsing agents may be used. Various rinsing baths may be used. For example, the rinsing bath may include a stagnant solution, or it may be a dump-rinser or cascade rinser. Other methods may be used to create laminar or turbulent flow of the rinsing solution with respect to reticle 2. Spray nozzles and water jets may be used.

After a sufficient rinsing time, reticle 2 and carrier 10 are removed from the rinsing bath and reticle 2 is then dried. Carrier 10 holds reticle 2 during the drying process. In one exemplary embodiment, the drying may take place in air with carrier 10 suspended from above such as from arm 26 and in another exemplary embodiment, carrier 10 may be placed on a horizontal surface to dry. In yet another exemplary embodiment, the carrier 50/holder 54 arrangement shown in FIG. 2 may be used and the drying takes place with carrier 50 suspended from above such as by arm 26 and carrier handle 54. The drying may take place in the ambient environment and at the ambient temperature of the production facility or an elevated temperature may be used. In one exemplary embodiment, drying takes place in the unheated calm air of the production facility.

Figure 4:
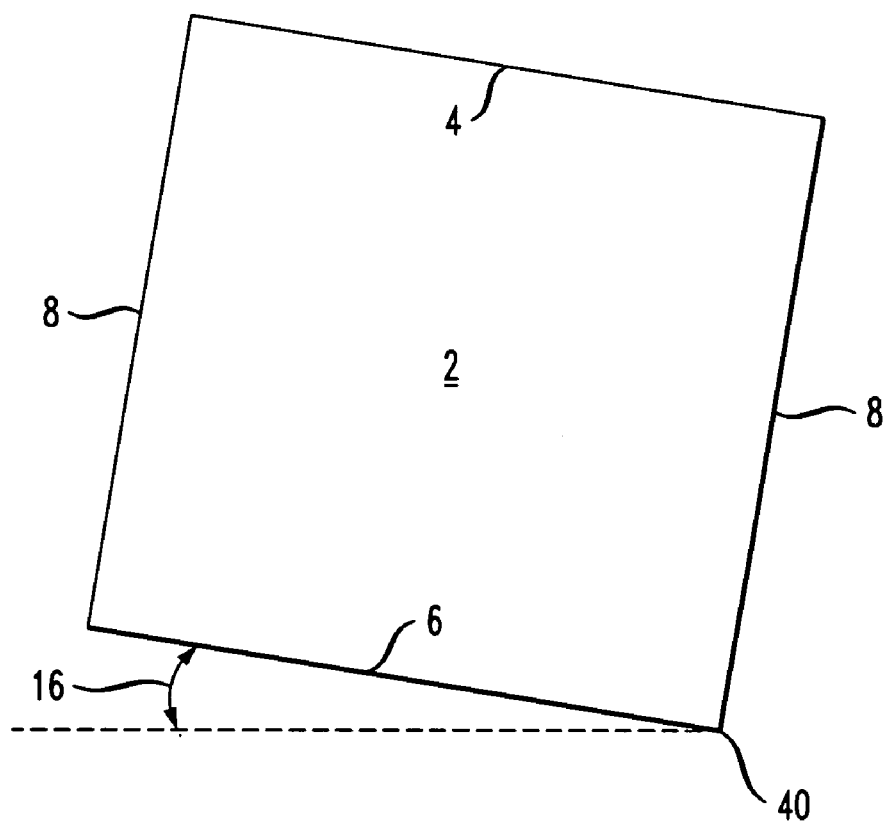
FIG. 4 is a side view showing a tilted reticle drying.

Reticle 2 is tilted at angle 16 during the drying process. The tilted orientation of reticle 2 during the drying process prevents water from being retained on top edge 4 or bottom edge 6 of reticle 2. FIG. 4 shows that any water present on edges 4, 6 or 8 of reticle 2 will preferably drip off of reticle 2 at tip 40 and produce a dry reticle free of water droplets and particles. In one embodiment in which DI water was the rinsing agent, applicants have found that the reticle was substantially free of DI water after only 6 minutes of ambient drying.

The preceding merely illustrates the principles of the invention. It will thus be appreciated that those skilled in the art will be able to devise various arrangements which, although not explicitly described or shown herein, embody the principals of the invention and are included within its spirit and scope. Furthermore, all examples and conditional language recited herein are principally intended expressly to be only for pedagogical purposes and to aid the reader in understanding the principals of the invention and the concepts contributed by the inventors to furthering the art, and are to be construed as being without limitation to such specifically recited examples and conditions. Moreover, all statements herein reciting principals, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for wet processing and drying a reticle comprising:
    providing a substantially flat and rectangular reticle that is wet; and
    drying said reticle by orienting a bottom edge of said reticle at an angle of at least about 8° with the horizontal.

2. The method as in claim 1, in which said drying includes maintaining said reticle in an upright position.

3. The method as in claim 1, wherein said drying comprises disposing said reticle in a carrier that orients said bottom edge of said reticle at said angle of at least about 8° with the horizontal when said carrier rests on a horizontal surface.

4. The method as in claim 1, wherein said drying comprises disposing said reticle in a carrier that orients said bottom edge of said reticle at said angle of at least about 8° with the horizontal when said carrier is suspended from a handle.

5. The method as in claim 4, wherein a bottom plane of said carrier is substantially parallel to said bottom edge.

6. The method as in claim 1, wherein said providing comprises causing liquid to contact said reticle.

7. The method as in claim 6, wherein said causing comprises submerging said reticle in said liquid with said bottom edge forming an angle of at least about 8° with the horizontal.

8. The method as in claim 6, wherein said causing comprises rinsing said reticle in DI water.

9. The method as in claim 1, wherein said providing comprises cleaning said reticle then rinsing said reticle in a DI water bath, then removing said reticle from said DI water bath in a carrier that positions said reticle such that a bottom edge of said reticle forms said angle of at least about 8° with the horizontal.

10. The method as in claim 9, wherein said drying includes retaining said reticle in said carrier during said drying.

11. The method as in claim 1, wherein said providing comprises at least one of cleaning and rinsing said reticle in a wet processing bath, then removing said reticle from said wet processing bath.

12. The method as in claim 1, wherein said drying comprises drying in air.

13. The method as in claim 1, wherein said angle lies within the range of 8° to 45° and drying comprises drying in unheated and substantially calm air for about 6 minutes such that said reticle is essentially dry.

14. A reticle drying apparatus comprising a carrier that holds a substantially rectangular and flat reticle such that a bottom edge of said reticle forms an angle of at least about 8° with the horizontal when said carrier is suspended from a carrier handle.

15. The reticle drying apparatus as in claim 14, wherein said carrier holds said reticle substantially upright.

16. The reticle drying apparatus as in claim 14, further comprising mechanical means for moving said carrier, said mechanical means coupled to said carrier.

17. The reticle drying apparatus as in claim 16, wherein said mechanical means positions said carrier in a bath that contains a liquid therein, and removes said carrier from said bath.

18. The reticle drying apparatus as in claim 17, wherein said mechanical means includes an essentially horizontal robotic arm and said carrier is suspended from said carrier handle that is essentially vertical and coupled to said robotic arm.

19. The reticle drying apparatus as in claim 14, wherein a bottom plane of said carrier forms an angle of at least about 8° with respect to the horizontal when suspended from said carrier handle.

20. The reticle drying apparatus as in claim 14, wherein said bottom edge is substantially parallel to a bottom plane of said carrier.

21. A reticle drying apparatus comprising at least a first bath with a cleaning liquid therein, a second bath with a rinsing liquid therein and means for mechanically transporting a substantially rectangular reticle out of said second bath in a carrier that positions a bottom edge of said reticle at an angle of at least about 8° with the horizontal when said carrier is suspended from a handle.

22. The reticle drying apparatus as in claim 21, wherein said carrier includes a bottom plane that is substantially parallel to said bottom of said reticle.

* * * * *